(12) United States Patent
Halbmaier (10) Patent No.: US 7,325,698 B2
(45) Date of Patent: Feb. 5, 2008

(54) WAFER CONTAINER DOOR WITH PARTICULATE COLLECTING STRUCTURE

(75) Inventor: David L. Halbmaier, Shorewood, MN (US)

(73) Assignee: Entegris, Inc., Chaska, MN (US)

( * ) Notice: Subject to any disclaimer, the term of this patent is extended or adjusted under 35 U.S.C. 154(b) by 16 days.

(21) Appl. No.: 11/108,620

(22) Filed: Apr. 17, 2005

(65) Prior Publication Data

US 2005/0258069 A1 Nov. 24, 2005

Related U.S. Application Data

(60) Provisional application No. 60/563,526, filed on Apr. 18, 2004.

(51) Int. Cl.
| B65D 45/16 | (2006.01) |
| B65D 51/24 | (2006.01) |
| B65D 85/86 | (2006.01) |
| B65D 25/54 | (2006.01) |
| B65D 85/30 | (2006.01) |

(52) U.S. Cl. ............. 220/326; 206/710; 206/711; 206/832; 220/377

(58) Field of Classification Search ........... 220/326, 220/212, 377; 206/710–712, 454, 832
See application file for complete search history.

(56) References Cited

U.S. PATENT DOCUMENTS

| 6,623,051 B2* | 9/2003 | Bonora | 292/330 |
| 6,644,477 B2* | 11/2003 | Bores et al. | 206/711 |
| 6,712,213 B2 | 3/2004 | Eggum | |
| 6,749,067 B2 | 6/2004 | Eggum | |
| 6,951,284 B2* | 10/2005 | Cheesman et al. | 206/711 |
| 6,955,197 B2* | 10/2005 | Elliott et al. | 141/98 |
| 7,040,487 B2* | 5/2006 | Zabka et al. | 206/710 |
| 2004/0074808 A1* | 4/2004 | Bhatt | 206/711 |
| 2005/0199529 A1* | 9/2005 | Matsutori | 206/710 |

FOREIGN PATENT DOCUMENTS

WO   WO 01/04022 A1   1/2001

* cited by examiner

Primary Examiner—Anthony D. Stashick
Assistant Examiner—Niki M. Eloshway
(74) Attorney, Agent, or Firm—Patterson, Thuente, Skaar & Christensen, P.A.

(57) ABSTRACT

A substrate container having an enclosure with an access opening for inserting and removing substrates into an interior of the enclosure and a door chassis that is configured to selectively enclose the opening, the door chassis comprising a first wall having a peripheral wall extending therefrom. The substrate container includes a latch mechanism that is operably coupled with the chassis, the latch mechanism configured to operably secure the chassis to the opening. The door of the substrate container includes a textured particle capture region wherein particles generated by the latch mechanism and elsewhere are captured by the particle capture region.

13 Claims, 9 Drawing Sheets

WAFER CONTAINER DOOR WITH PARTICULATE COLLECTING STRUCTURE

This application claims priority to U.S. Provisional Application 60/563,526, filed Apr. 18, 2004, entitled "WAFER CONTAINER DOOR WITH PARTICULATE COLLECTING STRUCTURE," which is incorporated herein by reference.

FIELD OF THE INVENTION

The present invention relates to substrate containers. More particularly, the present invention relates to substrate container doors having textured regions to trap and prevent the circulation of particles or particulates that are generated within the containers.

BACKGROUND OF THE INVENTION

Substrate containers are used in the semiconductor processing industry for storing and transporting semiconductor wafers, flat panel substrates, and film frames. Examples of containers that are used in the semiconductor processing industry are FOUPs (front opening unified pods), FOSBs (front opening shipping box), and SMIF (standardized mechanical interface) pods. Such containers generally have an enclosure with an open bottom or side that is sealingly closed by a door. The doors often have an interior compartment with a latch mechanism that is visible through a clear or transparent plastic door panel, which is usually formed of polycarbonate.

Processing of semiconductor wafers into finished electronic components typically requires many processing steps during which the wafers must be handled and processed. The wafers are very valuable, extremely delicate, and easily damaged by physical and electrical shocks. In addition, successful high-yield processing requires maximum cleanliness and freedom from particles or particulates and other contaminants. Because of this requirement, specialized containers or carriers have been developed for use during processing, handling, and transport of wafers. These containers protect the wafers from physical and electrical hazards and are sealable to protect the wafers from contaminants. Such wafer carriers or containers generally comprise an enclosure having a number of wafer holding shelves inside. One side of the container is open for access but can be enclosed by a door. The doors generally have a latch mechanism to securely retain and seal it in place. Normally, the latch mechanism is enclosed to protect it from damage and accidental actuation.

Although wafer enclosures are used in clean environments, undesirable contaminants can accumulate on and in the enclosure over time. Particulate contaminants are generated through frictional contact between parts of the enclosure and in the operation of loading and unloading wafers from the enclosure. Accordingly, an important characteristic for wafer containers is that they must be thoroughly cleanable to ensure that process cleanliness is maintained. Cleaning is generally accomplished with a liquid solution and the parts are dried afterward with compressed air or other gas.

Semiconductor wafer fabrication processes are often extremely sensitive to any contamination. Contaminants can be generated in various ways, e.g., by sliding contact of components, such as latching mechanism components, within the substrate container door. As substrate containers are used over time, they can generate and accumulate particulates. Over time, the particulate formation can result in visible smudging, smearing, and/or clouding of the transparent plastic door panels. While this presents an undesirable aesthetic result, such contaminants and particles or particulates also present the risk of entering the enclosure and contaminating the wafers.

Because the general problems discussed above have not been addressed by conventional wafer containers, there is a current need for a wafer container addressing the problems and deficiencies inherent with conventional designs.

SUMMARY OF THE INVENTION

The wafer container of the embodiments of the present invention substantially addresses the aforementioned problems of conventional designs by providing a particle capture feature that collects and captures particles or particulates and substantially alleviates the negative visible effects of such particulates and contamination.

A wafer container having an enclosure with an access opening for inserting and removing wafers into an interior of the enclosure and a door chassis that is configured to selectively enclose the opening. In a SMIF pod configuration, the door includes a top wall having a peripheral wall extending downwardly therefrom defining an door chassis interior. The wafer container includes a latch mechanism that is operably coupled with the chassis, the latch mechanism configured to operably secure the chassis to the opening. The wafer container also includes a panel including a particle capture region that is defined on an inner surface thereof, the panel configured to detachably couple the chassis, such that when the panel couples the chassis, the inner surface and chassis define a chassis interior, wherein particles or particulates generated by the latch mechanism are captured by the particle capture region.

A feature and advantage of embodiments of the invention is that the particles or particulates are trapped by the isolated textured region and obstructed from circulating within the door and potentially coming into contact with the wafers.

Another feature and advantage of embodiments of the invention is that the accumulation of particulates as exemplified by smudging or clouding on the transparent surface is eliminated or reduced.

BRIEF DESCRIPTION OF THE DRAWINGS

FIG. 7*a* is a top plan view of the inside surface of a panel having a particle capture region with linear ribbing according to an embodiment of the present invention;

FIG. 7b is a cross-sectional view of an embodiment of the particle capture region of FIG. 7a;

FIG. 8 is a cross-sectional view of an alternative embodiment of the particle capture region of FIG. 7a;

FIG. 9b is a cross-sectional view of depicting a geometry created by the crosshatched ribbing of FIG. 9a.

DETAILED DESCRIPTION OF THE PREFERRED EMBODIMENTS

Figure 1:
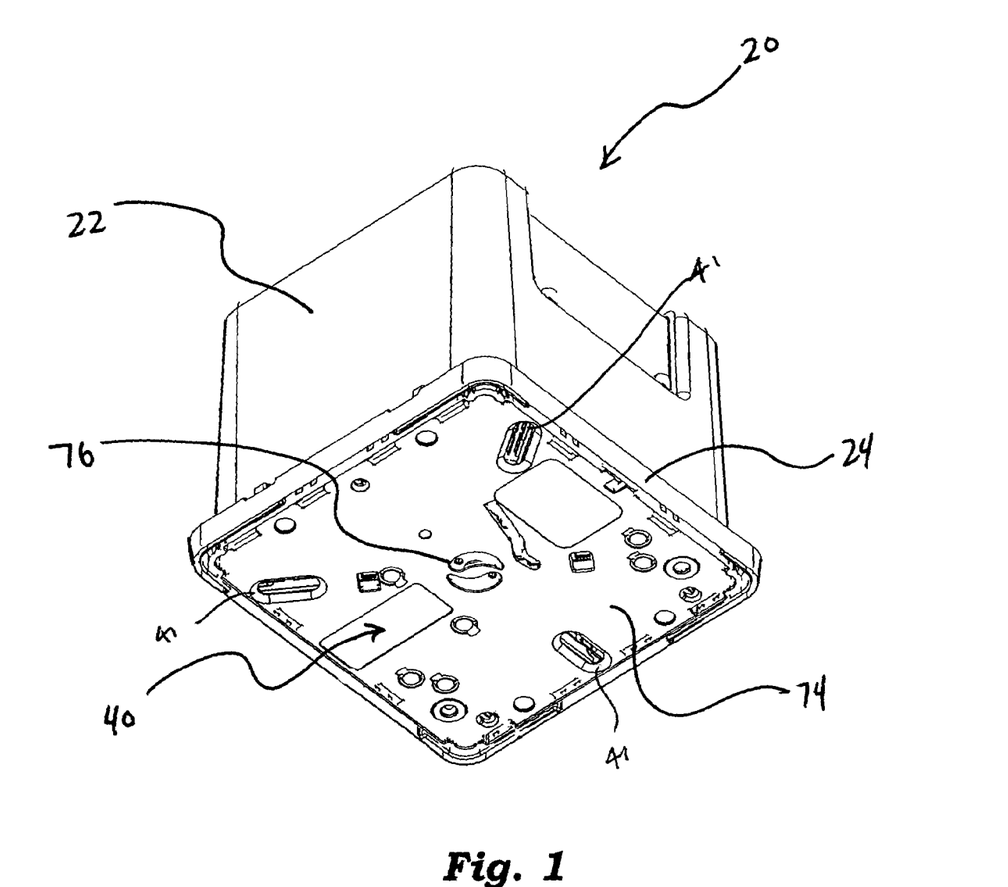
FIG. 1 is a bottom perspective view of a wafer container with a door according to an embodiment of the present invention.
Figure 2:
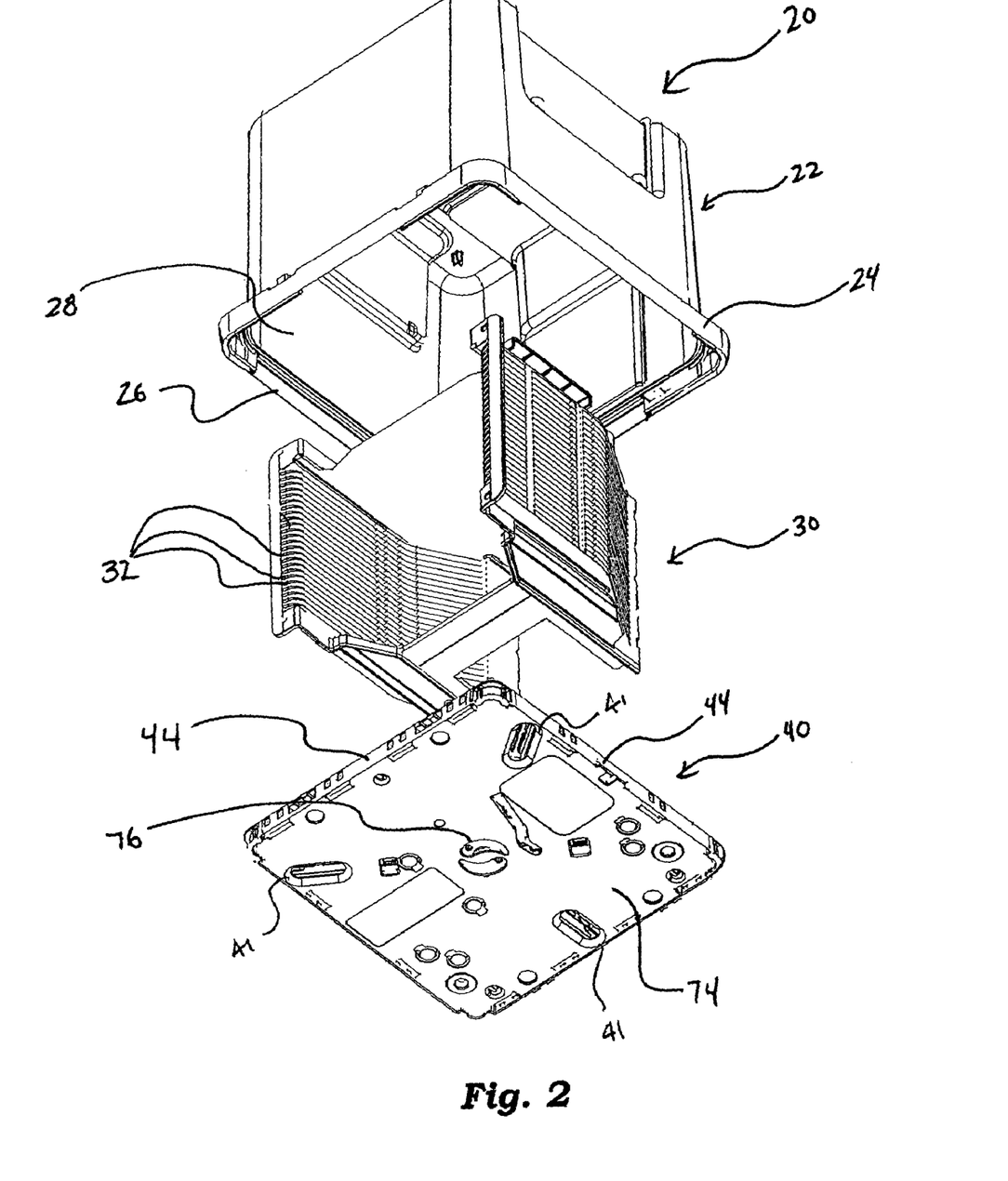
FIG. 2 is an exploded view of a wafer container having a door and a wafer tray according to an embodiment of the present invention.
Figure 3:
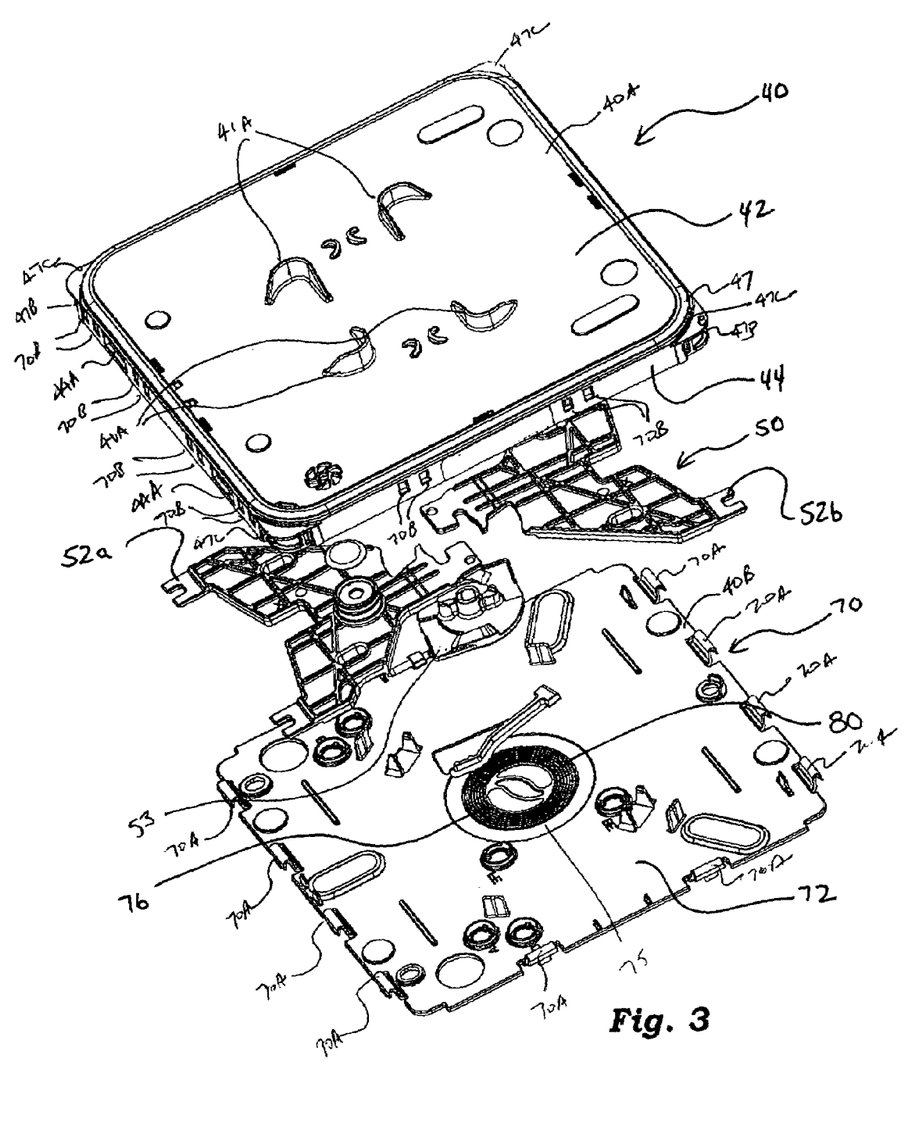
FIG. 3 is a bottom exploded view of the door of a wafer cassette according to an embodiment of the present invention.

A substrate container 20 for carrying substrates is depicted in FIGS. 1-3. Referring to FIG. 2, wafer container 20 generally includes an enclosure 22 having a door frame 24 defining access opening 26 for accessing interior 28 of container 20, cassette 30 having a plurality of slots 32 for receiving and holding wafers (not depicted), and door 40 for sealably closing access opening 26. Door 40 generally includes door chassis portion 40A and panel portion 40B. Door 40 may include a plurality of kinematic coupling grooves 41 for locating and securing container 20 on a piece of processing equipment (not depicted). Door 40 may also include locating structures 41A for receiving and retaining cassette 30. Referring to FIG. 3, door 40 may include top wall 42 and peripheral wall 44 extending away from top wall 42. Peripheral wall 44 and top wall 42 define interior space 46 of door 40. Door 40 may include a gasket 47 along door periphery 47A for sealingly engaging enclosure portion 22. Door guides 47B may be provided at each corner 47C to accurately locate door 40 in door frame 24.

Door 40 may also include at least one latch mechanism 50 disposed in interior space 46 of door 40 for securing door 40 in door frame 24 of enclosure 22. Latch mechanism 50 may include a pair of latch arms 52(A), 52(B), pivotally coupled to lower surface (not depicted) of top wall 42. Each of latch arms 52(A), 52(B), is retractably extendable through openings 44A in peripheral wall 44 of door 40 and each is configured to latch to door frame 24 of enclosure 22 for securing door 40 in door frame 24. Cam 53 is rotatably coupled to the lower surface of top wall 42 and is coupled with each of latch arms 52(A), 52(B), so that rotation of cam 53 simultaneously moves each of latch arms 52(A), 52(B) laterally through openings 43A to engage and disengage from door frame 24. An example of a wafer container having a door with a latch mechanism contained therein is disclosed in U.S. Pat. No. 6,749,067, owned by Applicant, which is incorporated herein by reference.

Although the actuating portion of latch mechanism 50 is depicted and described herein as a rotating cam, any other suitable member or mechanism capable of imparting a linear sliding motion to latch arms 52(A), 52(B), can be used, including a rack and pinion mechanism such as depicted in PCT Application No. WO 01/04022 A1 also hereby incorporated herein by reference. Further details of a cam-operated latching mechanism suitable for use with the various embodiments of the present invention are disclosed in U.S. Pat. No. 6,712,213 and co-pending patent applications Ser. Nos. 10/317,023, and 10/318,374, each incorporated herein by reference.

Figure 4:
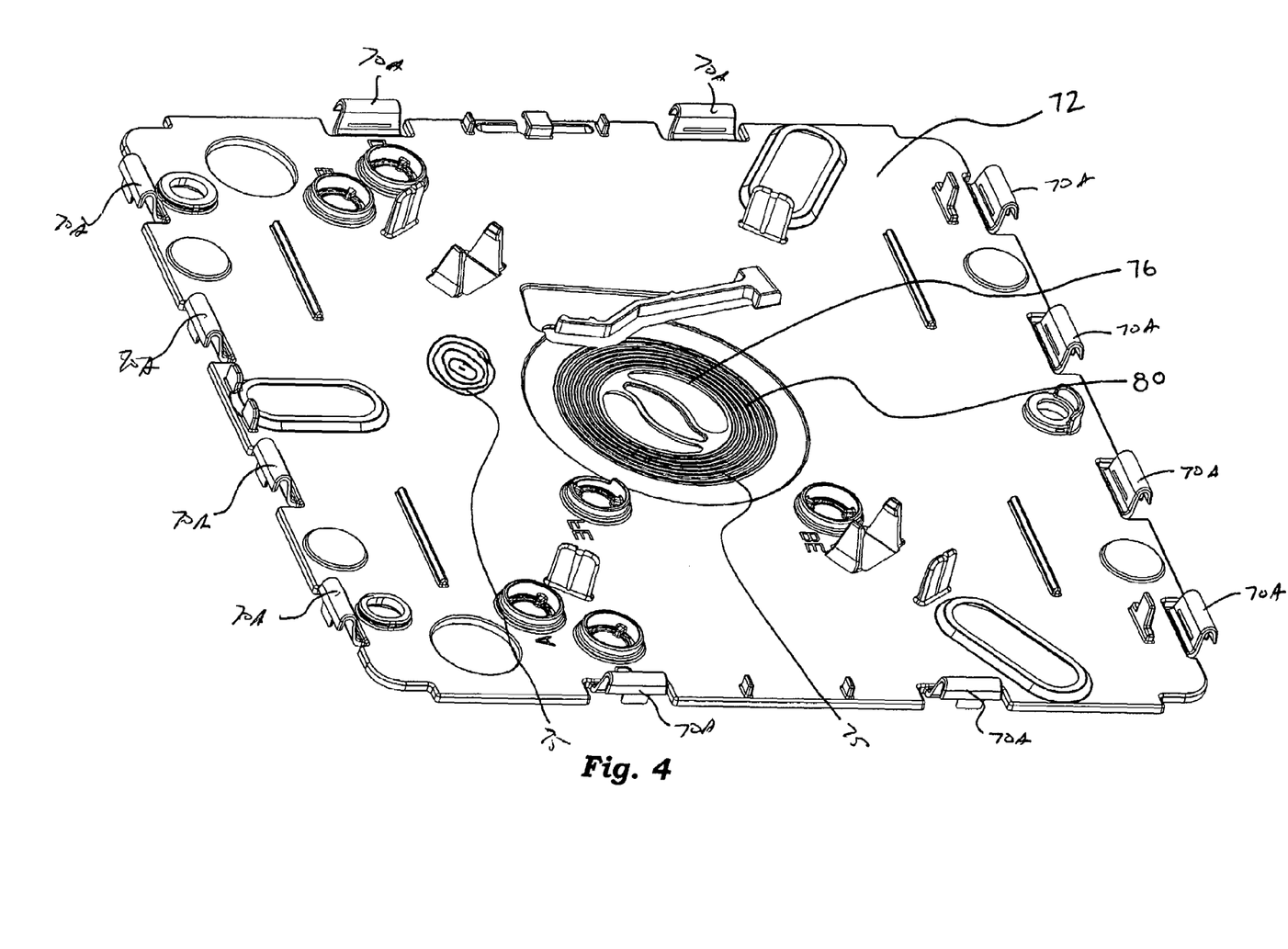
FIG. 4 is a perspective view of a panel of the door according to an embodiment of the present invention.
Figure 5:
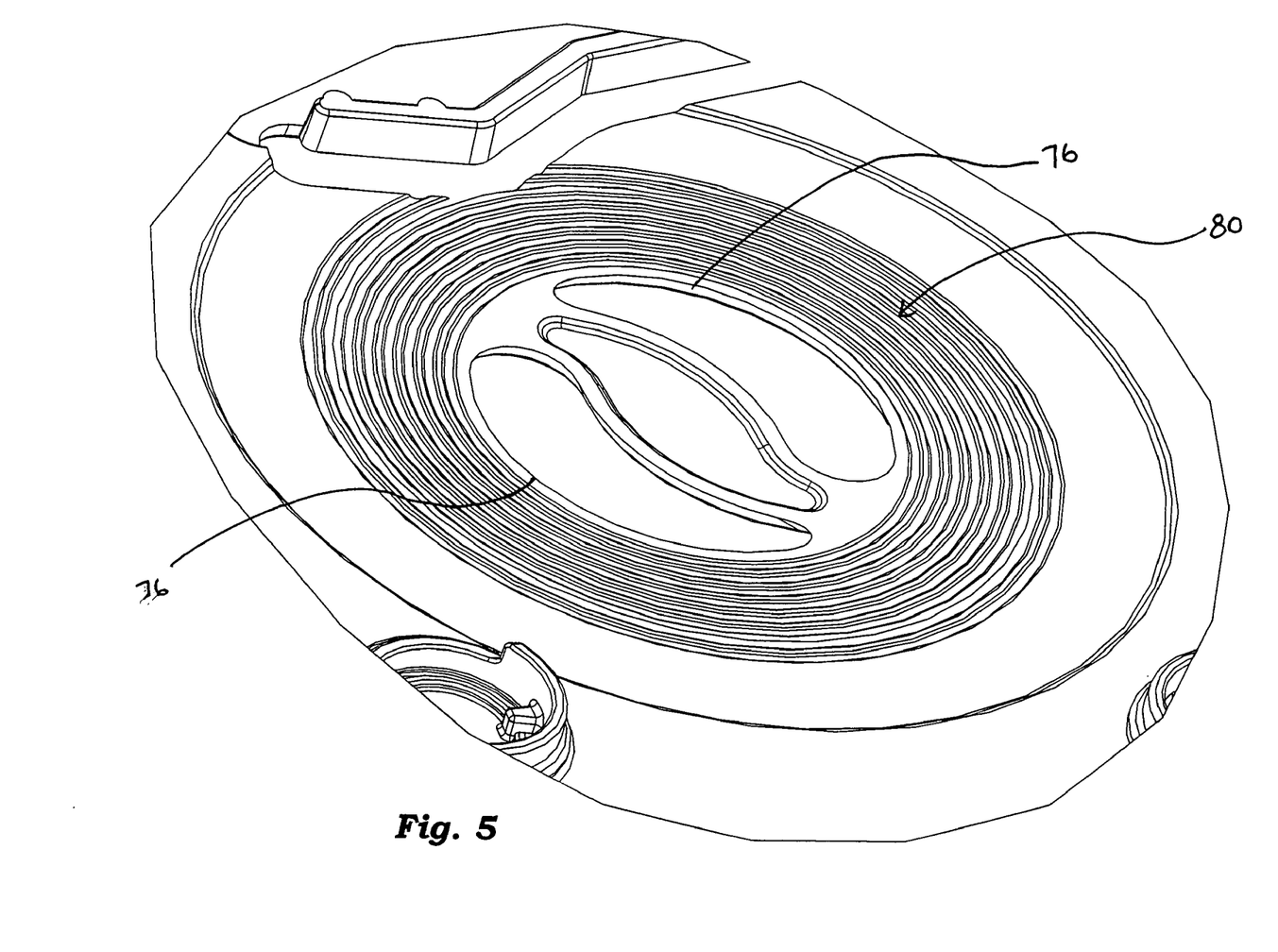
FIG. 5 is a close-up view of a panel depicting undulating geometry on the inside surface of the panel according to an embodiment of the present invention.

Referring to FIGS. 3-5, panel 40B in the form of transparent panel 70 may be removably coupled to peripheral wall 44 of door 40 for enclosing interior 48. Clips 70A engage in receiving structures 70B on chassis 40A. While, in an embodiment, panel 70 is transparent, panel 70 may also be non-transparent without departing from the scope of the present invention. Panel 70 has an upper or inside surface 72, as depicted in FIGS. 3 and 4 and a lower or outside surface 74 as depicted in FIGS. 1 and 2. When coupled to peripheral wall 44 of door 40, upper surface 72 of panel 70 faces interior 46 of door 40. In one embodiment of the invention, panel 70 has a pair of openings 76 extending therethrough for providing access to cam 53. As particularly depicted in FIG. 6, the pair of openings 74 may have a generally oval configuration, however, other configurations are also possible.

In an embodiment, inside surface 72 of transparent panel 70 may include particle capture regions 75 in the form of discrete textured regions 80 to trap and prevent the dissemination of particles or particulates generated by moving components disposed in interior 46 confronting each other or any other portion of door 40 or transparent panel 70. While, in an embodiment, textured region 80 is isolated, a plurality of textured regions 80 can be distributed on inner surface 72 without departing from the scope of the present invention. The discrete textured portion 80 of transparent panel 70 may be positioned anywhere on inside surface 72 of transparent panel 70. As particularly illustrated in FIGS. 4-7, textured portion 80 is positioned generally adjacent to cam 53 and proximate openings 74. In various embodiments, textured region 80 may be positioned generally proximate any moving components such that generated particles or particulates fall into textured region 80 and become trapped therein. In another embodiment of the invention, varying degrees of inside surface 72 are textured. Textured region 80 may also serve as a bearing surface with the texturing configured suitably for such bearing surface.

Any mechanical, chemical or optical process may be used to impart a texture into inside surface 72 of transparent panel 70. For example, textured region 80 will typically be made by molding, but alternatives such as etching or laser machining may be appropriate in certain applications. Also for example, a preformed piece or film with suitable, texturing, and surface properties may be insert molded into the cover. Such preformed textured portion may also serve as a bearing surface. Other processes may also be used without departing from the scope of the present invention.

Figure 6A:
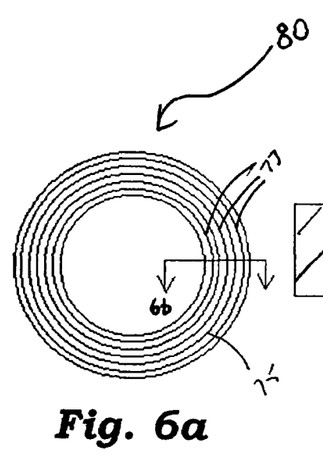
FIG. 6*a* is a top plan view of the inside surface of a panel having a particle capture region with concentric ribbing according to an embodiment of the present invention.
Figure 6B:
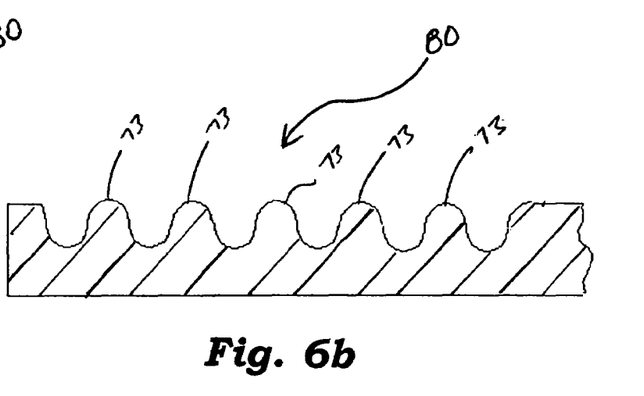
FIG. 6*b* is a cross-sectional view of the particle capture region of FIG. 6*a*.
Figures 7A, 7B:
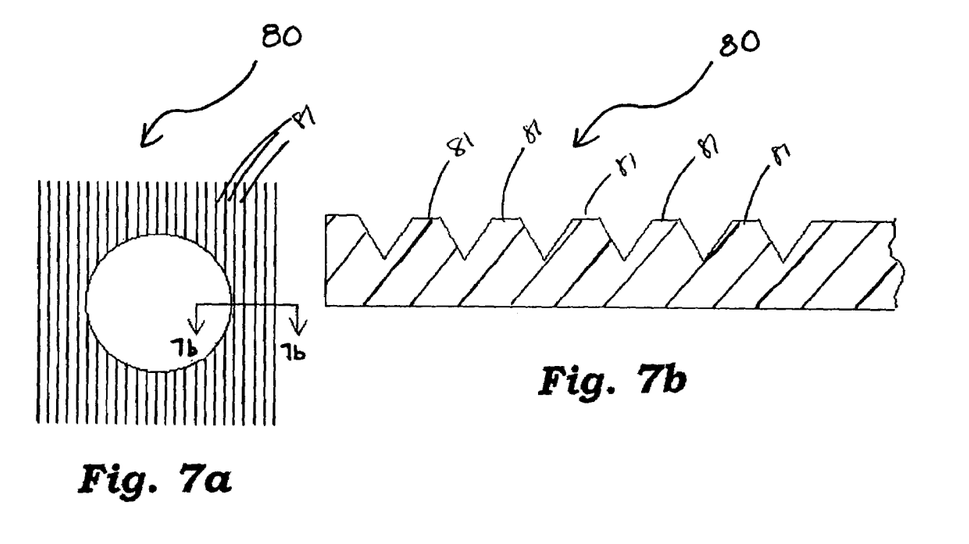
Figure 8:
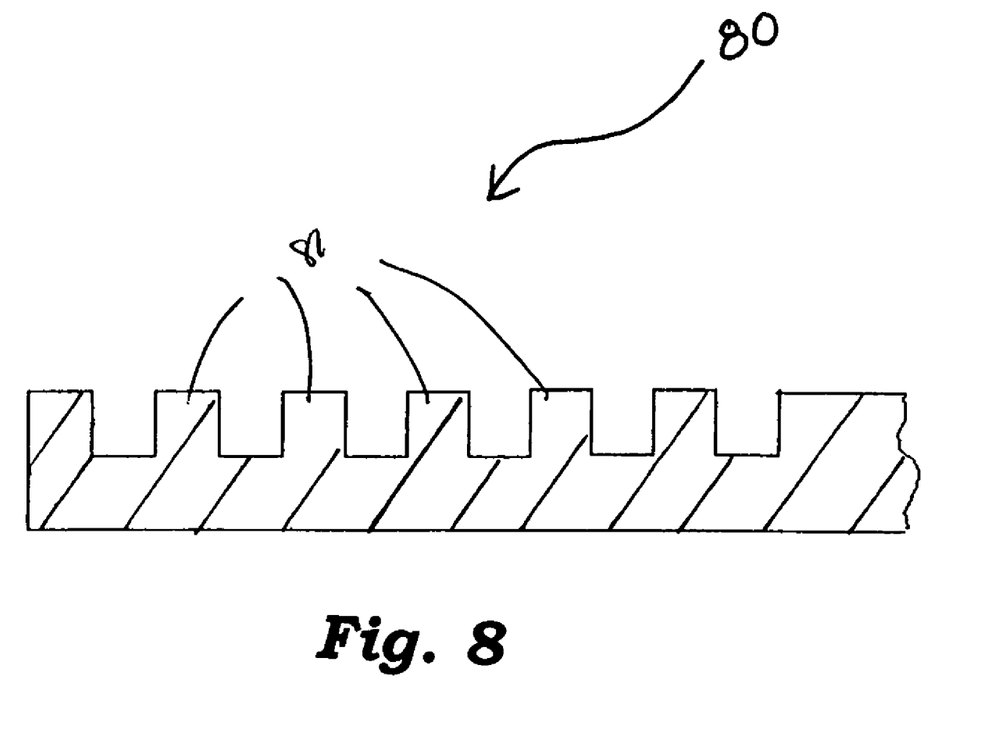
Figure 9A:
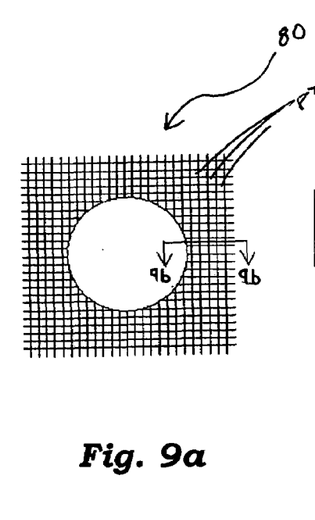
FIG. 9a is a top plan view of the inside surface of the panel with a particle capture region having cross-hatched ribbing according to an embodiment of the present invention.
Figure 9B:
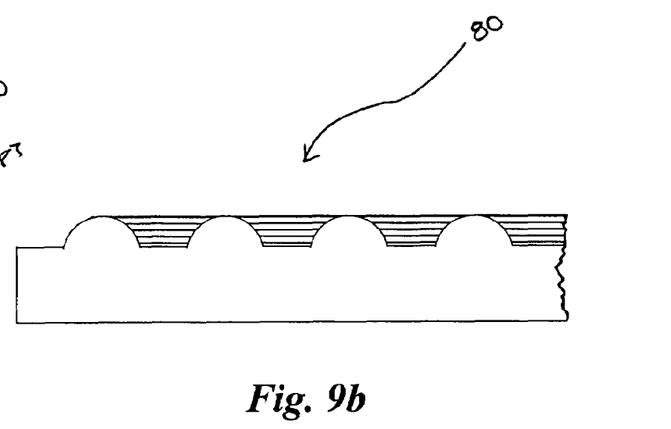
Figure 9C:
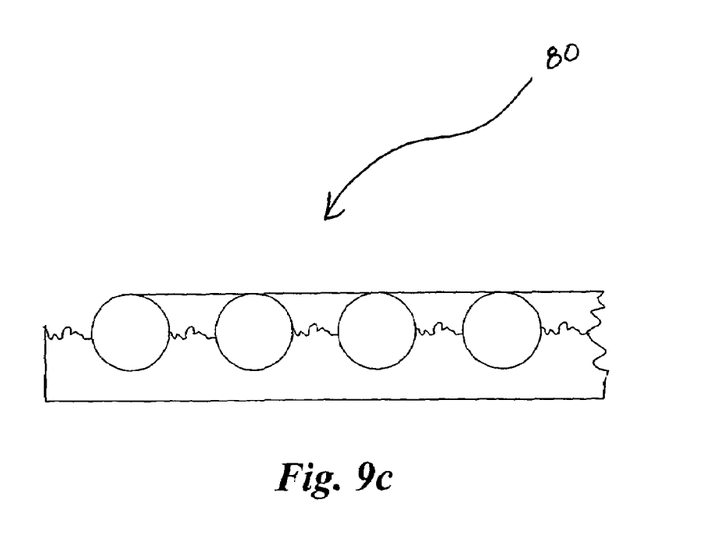
FIG. 9c is a cross-sectional view of depicting a particle capture region with random geometry created by the crosshatched ribbing according to an embodiment of the present invention.

Referring to FIGS. 6a-9b, various textures may be used to create the textured region 80. For example, as depicted in FIGS. 6a, 6b inside surface 72 of transparent panel 70 may consist of a plurality of concentric ribs 73. As depicted in FIG. 6b, the concentric ribs 73 may have a generally undulating cross sectional geometry. In the alternative embodiment of FIGS. 7a, 7b, 8, textured region 80 may include linear ribs 81. The linear ribbing may have varying cross sectional geometries. For instance, as depicted in FIG. 7b, a v-notched cross sectional geometry may be formed into inside surface 72 to form textured surface 80 of particle capture region 75. As depicted in FIG. 8, a square-notched cross sectional geometry may also be formed. In another embodiment, as depicted in FIG. 9a, crosshatched ribs 83 may be formed on inside surface 72 of transparent panel 70 to form textured surface 80 of particle capture region 75. As particularly illustrated in FIGS. 9b and 9c, an irregular and/or complex cross sectional geometry may also be formed on inside surface 72 to form textured surface 80 of particle capture region 75. Other cross sectional geometric shapes are envisioned within the scope of the invention and those discussed should not be considered limiting.

In other embodiments, textured region 80 may be imparted onto inside surface 72 of transparent panel 70 by adhering a film having a textured upper surface. The textured film permits a user to position textured region 80 anywhere particles or particulates are being generated. In yet another embodiment, an adhesive may be positioned on inside surface 72 of transparent panel 70 to capture any particulates that may be generated.

In operation, textured region 80 is imparted on to or into inside surface 72 of transparent panel 70 at the time of manufacture. As wafer container 20 is being used, the various moving components disposed in interior 46 of door 40 generate particles or particulates. Because transparent panel 70 is disposed below door 70, the particulates will fall onto inside surface 72 of transparent panel 70. As the particulates fall onto inside surface 72 they become trapped in textured region 80, thereby preventing circulation of the particulates through interior 46 of door 70 and potentially coming into contact with the enclosed wafers. When a user desires to remove the particles from the interior of door 46 and textured region 80, the user simply detaches panel 70 from door 46, removes the particles, and replaces panel 70 on door 46.

Although the present invention has been described with reference to particular embodiments, one skilled in the art will recognize that changes may be made in form and detail without departing from the spirit and the scope of the invention. Therefore, the illustrated embodiments should be considered in all respects as illustrative and not restrictive.

What is claimed is:

1. A sealable container for holding a plurality of wafers in an axially aligned spaced apart relation, the container comprising:
    an enclosure portion defining an interior space and having a door frame defining an access for inserting and removing the wafers from the enclosure portion;
    a door sealably fittable in the door frame to close the access, the door including a plurality of walls and a transparent panel defining an open interior of the door, the transparent panel having an inside facing surface and at least one operable latch mechanism disposed in the door for securing the door in place in the door frame, the at least one operable latch mechanism accessible and operable from exterior of the door through an opening in the transparent panel; and
    a textured region that captures particles, the textured region being defined on the inside facing surface of the transparent panel of the door and having a texturing discrete and isolated from areas of the inside facing surface that are outside the textured region, the textured region being_proximate the at least one operable latch mechanism and disposed around the opening in the transparent panel on the inside surface, the texturing of the textured region including at least one of an irregular and a repeating geometry.

2. The container of claim 1, wherein the texturing is_selected from the group consisting of:
    concentric ribbing;
    v-notched linear ribbing;
    u-notched linear ribbing;
    square-notched linear ribbing;
    crosshatched ribbing;
    random geometry ribbing; and
    any combination thereof.

3. The container of claim 1, wherein the textured_region comprises a film disposed on the inside facing surface of the transparent panel.

4. The container of claim 1, wherein the textured region comprises an adhesive.

5. The container of claim 1 further comprising a plurality of textured regions disposed on the transparent panel, each of the textured regions having texturing discrete from areas of the inside facing surface that are outside the plurality of textured regions.

6. A method of abating particulate contamination within a substrate container, the method comprising:
    providing an enclosure having an access opening for inserting and removing substrates into an interior of the enclosure and a door for closing the access opening, the door including a chassis and a latch mechanism on the chassis for retaining the door in the access opening;
    detachably coupling a transparent panel having an inner surface thereon to the chassis, such that the inner surface and chassis define a chassis enclosure; and
    disposing a texturing on the inner surface of the transparent panel that defines a particle capture region in the chassis enclosure proximate the latch mechanism so that particles generated by operation of the latch mechanism are captured within the particle capture region, the texturing being discrete from areas on the inner surface that are outside the particle capture region.

7. The method of claim 6, further comprising detaching the transparent panel from the chassis to remove any particles captured therein.

8. The method of claim 6, further comprising selecting the texturing from the group consisting of:
    concentric ribbing;
    v-notched linear ribbing;
    u-notched linear ribbing;
    square-notched linear ribbing;
    crosshatched ribbing;
    random geometry ribbing; and
    any combination thereof.

9. The method of claim 6, further comprising:
    providing a film that includes the texturing;
    detaching the transparent panel from the chassis to remove the film and any particles captured thereon; and
    replacing the film with a second film, the second film having a texturing discrete from areas on the inner surface that are outside the particle capture region.

10. The method of claim 6, further comprising:
    detaching the transparent panel from the chassis to remove the adhesive and any particles captured thereon; and
    replacing the adhesive with a second adhesive having a texturing, the texturing being discrete from areas on the inner surface that are outside the particle capture region,
    wherein the step of disposing a texturing on the inner surface of the transparent panel includes providing an adhesive on the particle capture region.

11. A method of making a substrate container comprising:
    providing an enclosure having an access opening for inserting and removing substrates into an interior of the enclosure;
    providing a door for selectively closing the access opening, the door including a door chassis and a latch mechanism operatively coupled with the door chassis;

coupling a panel having an inner surface thereon to the door chassis such that the inner surface and chassis define a chassis enclosure; and etching a particle capture region on the inner surface of the panel such that the particle capture region can capture particles generated by the latch mechanism, the particle capture region having a texturing discrete from areas on the inner surface that are outside the particle capture region, wherein the step of providing a particle capture region comprises etching the texturing into the inner surface.

12. A method of making a substrate container comprising:

providing an enclosure having an access opening for inserting and removing substrates into an interior of the enclosure;

providing a door for selectively closing the access opening, the door including a door chassis and a latch mechanism operatively coupled with the door chassis;

coupling a panel having an inner surface thereon to the door chassis such that the inner surface and chassis define a chassis enclosure; and etching a particle capture region on the inner surface of the panel such that the particle capture region can capture particles generated by the latch mechanism, the particle capture region having a texturing discrete from areas on the inner surface that are outside the particle capture region, wherein the step of providing a particle capture region comprises laser machining the texturing into the inner surface.

13. A method of making a substrate container comprising:

providing an enclosure having an access opening for inserting and removing substrates into an interior of the enclosure;

providing a door for selectively closing the access opening, the door including a door chassis and a latch mechanism operatively coupled with the door chassis;

coupling a panel having an inner surface thereon to the door chassis such that the inner surface and chassis define a chassis enclosure; and etching a particle capture region on the inner surface of the panel such that the particle capture region can capture particles generated by the latch mechanism, the particle capture region having a texturing discrete from areas on the inner surface that are outside the particle capture region, wherein the step of providing a particle capture region comprises randomly forming the texturing on the inner surface.

* * * * *

UNITED STATES PATENT AND TRADEMARK OFFICE
CERTIFICATE OF CORRECTION

| | | |
|---|---|---|
| PATENT NO. | : 7,325,698 B2 | Page 1 of 1 |
| APPLICATION NO. | : 11/108620 | |
| DATED | : February 5, 2008 | |
| INVENTOR(S) | : David L. Halbmaier | |

It is certified that error appears in the above-identified patent and that said Letters Patent is hereby corrected as shown below:

Column 5, line 53, delete "being_proximate" and insert --being proximate--

Column 5, lines 58-59, delete "is_selected" and insert --is selected--

Column 6, line 1, delete "textured_region" and insert --textured region--

Signed and Sealed this

Thirty-first Day of March, 2009

JOHN DOLL
*Acting Director of the United States Patent and Trademark Office*